United States Patent
Strom et al.

(10) Patent No.: US 11,496,094 B1
(45) Date of Patent: Nov. 8, 2022

(54) VOLTAGE-CONTROLLED OSCILLATOR WITH CENTERTAP BIAS

(71) Applicant: International Business Machines Corporation, Armonk, NY (US)

(72) Inventors: James Strom, Rochester, MN (US); Herschel Akiba Ainspan, New Hempstead, NY (US); Andrew D. Davies, Rochester, MN (US); John Borkenhagen, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/239,862

(22) Filed: Apr. 26, 2021

(51) Int. Cl.
*H03B 5/12* (2006.01)

(52) U.S. Cl.
CPC ..... *H03B 5/1212* (2013.01); *H03B 2200/004* (2013.01); *H03B 2200/0088* (2013.01)

(58) Field of Classification Search
CPC .................................................. H03B 5/1212
USPC ....................................................... 331/117 R
See application file for complete search history.

(56) References Cited

U.S. PATENT DOCUMENTS

| | | | |
|---|---|---|---|
| 4,621,205 A | 11/1986 | Miller | |
| 6,281,758 B1 | 8/2001 | Elsayed et al. | |
| 6,504,443 B1 | 1/2003 | Eguizabal | |
| 6,765,448 B2 | 7/2004 | Wu et al. | |
| 7,038,527 B2 | 5/2006 | Titus et al. | |
| 7,221,234 B2 | 5/2007 | Chien | |
| 8,031,019 B2 | 10/2011 | Chawla et al. | |
| 8,098,109 B2 | 1/2012 | Li et al. | |
| 8,159,308 B1 * | 4/2012 | Sutardja | H03B 5/129 331/185 |
| 8,466,750 B2 | 6/2013 | Chiu et al. | |
| 2004/0032302 A1 * | 2/2004 | Chominski | H03B 5/1209 331/100 |
| 2008/0111642 A1 | 5/2008 | Bohorquez | |

FOREIGN PATENT DOCUMENTS

WO     03061108 A1     7/2003

OTHER PUBLICATIONS

Xizhen et al., "A low-phase-noise LC-VCO with an enhanced-Q varactor for use in a high-sensitivity GNSS receiver," Journal of Semiconductors, vol. 33, No. 5, May 2012, pp. 1-6.

* cited by examiner

*Primary Examiner* — Joseph Chang
(74) *Attorney, Agent, or Firm* — Peter J. Edwards

(57) ABSTRACT

A voltage-controlled oscillator comprises a varactor. A capacitance of the first varactor is dependent upon a control voltage. The voltage-controlled also comprises an inductor. The inductor is connected to a center-tap connection. The voltage-controlled oscillator also comprises a power source. The power source is configured to provide a bias voltage to the inductor through the center-tap connection. The voltage-controlled oscillator also comprises a coupling capacitor. The coupling capacitor is located between the inductor and the varactor. The voltage-controlled oscillator also comprises a coupling resistor. The coupling resistor is located between the coupling capacitor and the center-tap connection. The center-tap connection provides the bias voltage to the coupling capacitor through the coupling resistor.

19 Claims, 4 Drawing Sheets

VOLTAGE-CONTROLLED OSCILLATOR WITH CENTERTAP BIAS

BACKGROUND

The present disclosure relates to voltage-controlled oscillator circuits, and more specifically, to reducing jitter in voltage-controlled oscillator circuits.

Voltage-controlled oscillator circuits (sometimes referred to herein as "voltage-controlled oscillators," "VCOs," or "VCO circuits") are designed to provide an oscillating output signal at a consistent frequency. The frequency of this output signal can then be used, for example, to set the clock frequency for modules in a computer processor other components in a computer system into which the VCO is incorporated. The frequency of the VCO circuit's output signal can be increased or decreased by modifying a control voltage that is input to the VCO circuit.

Voltage-controlled oscillator circuits are typically integrated into a phase-lock loop, which regulates the frequency of the VCO circuit's output by modifying the VCO circuit's control voltage. Typical phase-lock loops compare the frequency of the VCO circuit with a reference-clock frequency, and adjust the control voltage as needed to reduce differences between the frequency of the VCO circuit's output and the frequency of the reference clock.

SUMMARY

Some embodiments of the present disclosure can be illustrated as a voltage-controlled oscillator. The voltage-controlled oscillator comprises a varactor. A capacitance of the varactor is dependent upon a control voltage. The voltage-controlled oscillator comprises an inductor. The inductor is connected to a center-tap connection. The voltage-controlled oscillator also comprises a power source configured to provide a bias voltage to the inductor through the center-tap connection. The voltage-controlled oscillator also comprises a coupling capacitor located between the inductor and the varactor. The voltage-controlled oscillator also comprises a coupling resistor located between the coupling capacitor and the center-tap connection. The center-tap connection provides the bias voltage to the coupling capacitor through the coupling resistor.

Some embodiments of the present disclosure can also be illustrated as a system. The computer system comprises a processor and voltage-controlled oscillator. The voltage-controlled oscillator comprises a varactor. A capacitance of the varactor is dependent upon a control voltage. The voltage-controlled oscillator comprises an inductor. The inductor is connected to a center-tap connection. The voltage-controlled oscillator also comprises a power source configured to provide a bias voltage to the inductor through the center-tap connection. The voltage-controlled oscillator also comprises a coupling capacitor located between the inductor and the varactor. The voltage-controlled oscillator also comprises a coupling resistor located between the coupling capacitor and the center-tap connection. The center-tap connection provides the bias voltage to the coupling capacitor through the coupling resistor.

Some embodiments of the present disclosure can also be illustrated as a method of providing a bias voltage to a voltage-controlled circuit. The method comprises providing the bias voltage to an inductor of the voltage-controlled circuit from a power source and through a center-tap connection of the inductor. The method also comprises providing the bias voltage to a coupling capacitor of the voltage-controlled circuit from the power source and through the center-tap connection.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
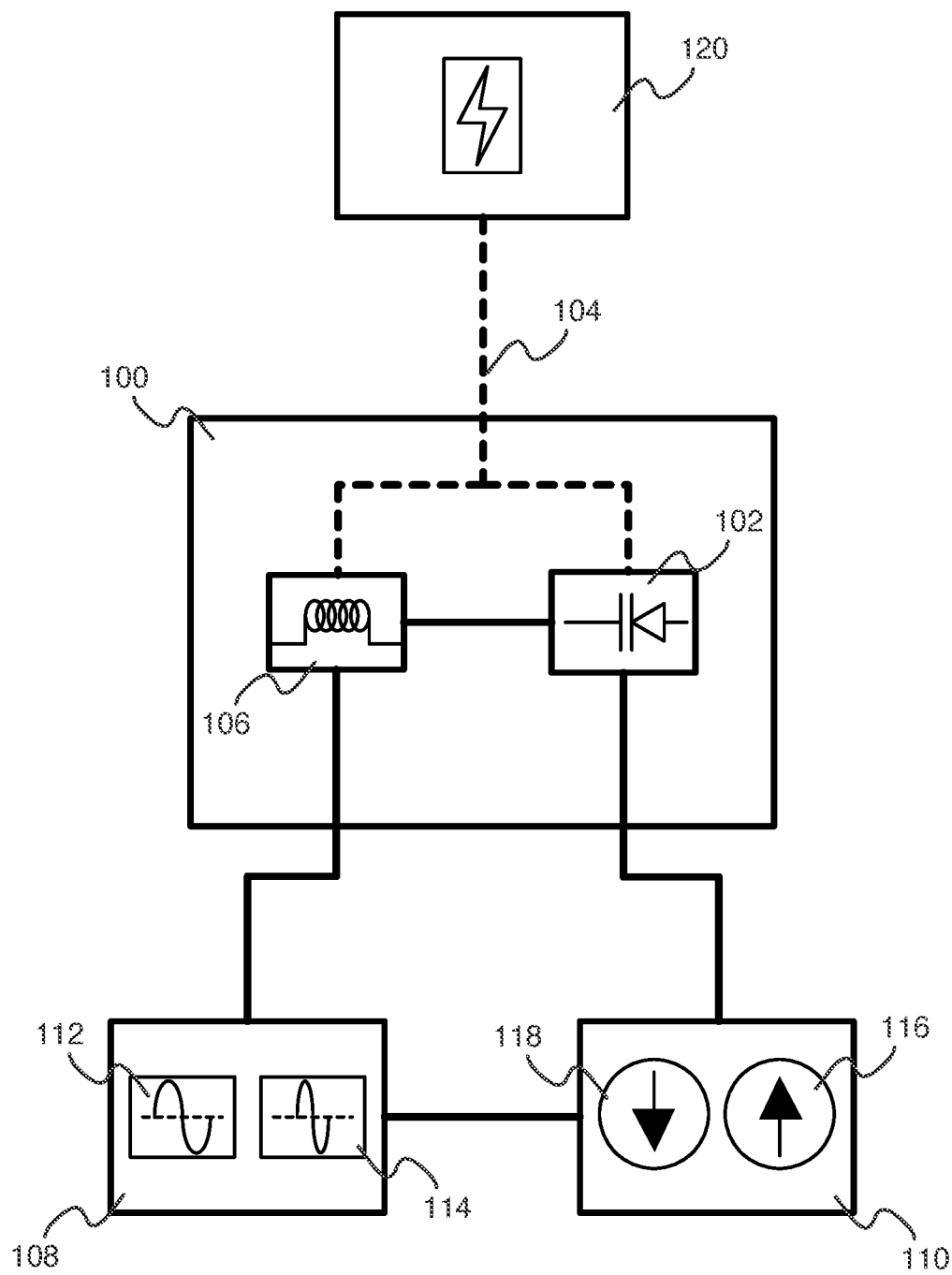
FIG. 1 depicts an abstract representation of a varactor node connected to a center-tap bias in a voltage-controlled oscillator circuit that is integrated into a phase-lock loop, in accordance with embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present disclosure relates to voltage-controlled oscillator circuits, and more specifically, to reducing jitter in voltage-controlled oscillator circuits. While the present disclosure is not necessarily limited to such applications, various aspects of the disclosure may be appreciated through a discussion of various examples using this context.

Voltage-controlled oscillator circuits (sometimes referred to herein as "voltage-controlled oscillators," "VCOs," or "VCO circuits") are often used to provide a clock signal for the various modules of a microprocessor (e.g., a logic module), other components of a computer system, or modules of such a component. As such, a VCO may, for example, take the form of a circuit built into a computer microprocessor or a device added to a system board. A typical VCO is designed to output one or more signals at a set, predetermined frequency. For example, a VCO typically oscillates between a high-voltage signal and a low-voltage signal. In some VCOs, for example, this oscillation may be between a 5 V signal and a 0 V signal (i.e., no signal), a 5 V signal and a -5 V signal, or a 10 V signal and a 5 V signal. The speed of this oscillation is referred to the VCO's frequency or oscillation frequency.

The output signal of a VCO is typically provided by an inductor that is driven by one or more transistors. In some VCO designs, this inductor and transistors operate at a voltage that is provided through a center-tap connection between the inductor and a power source. This is often referred to as "biasing," as the power source maintains a desired bias voltage at the inductor, which aids in maintaining stable operations of the inductor. The voltage provided by this center-tap connection may be referred to herein as the "center-tap bias voltage" or simply the "center-tap voltage."

The speed at which the inductor switches between the high signal and the low signal is often referred to as the VCO's frequency or the oscillation frequency. In ideal theoretical designs, the VCO oscillation frequency would be completely consistent with the target oscillation frequency. This would enable, for example, a set of processor cores that operate according to the clock signal provided by the VCO to operate at the very edge of their tolerances because there would be no need to account for inconsistencies between the expected system timing and the actual system timing. However, in practice, several aspects of the VCO and the environment in which the VCO operates can increase the variation in the amount of time between individual signal oscillations of the VCO.

This variation is sometimes referred to as "jitter," and can reduce the ability of the VCO to operate at high oscillation frequencies. This is partially because high oscillation frequencies, by nature, result in smaller time periods between each oscillation. In other words, the time between individual oscillations at high oscillation frequencies is lower. Thus, variations in the time between individual oscillations reflect a larger percentage change at high frequencies. For example, a VCO that is oscillating at 5 GHz switches between a high signal (e.g., 2.5 V) and a low signal (e.g., -2.5 V) every 0.2 nanoseconds, whereas a VCO that is oscillating at 50 GHz switches between a high signal and a low signal every 0.02 nanoseconds. For this reason, a variation of 0.005 nanosecond in the amount of time between each oscillation (i.e., a jitter of $5*10^{-9}$ milliseconds) results in a far greater percentage change in the 50 GHz frequency than the 5 GHz frequency.

As a result, components of high-performance computer systems that are designed to operate at a very high clock frequencies may be more sensitive to jitter in a VCO circuit than lower-performance systems that are designed to operate at lower clock frequencies. However, as mentioned previously, reducing jitter in a clock signal often enables components that are controlled by that clock signal to operate closer to their performance limit. By extension, then, by reducing the variation of time between VCO oscillations, the VCO is able to operate closer to the limit of the components of the connected computer system, increasing system performance.

To help control the oscillating frequency of a VCO, the frequency of the VCO output signal can be compared to an output signal of an accurate reference clock. For example, typical VCOs are incorporated into a phase-lock loop, which typically determine the deviation between the VCO oscillation frequency and a reference frequency by comparing them in a phase comparator. Oftentimes the VCO oscillation frequency is adjusted to the magnitude of the reference clock. For example, if a VCO ideally operates at a 25 GHz frequency and a reference clock operates at a 100 MHz frequency, the VCO oscillation frequency may be divided by 250 before being compared to the reference clock. This division may be referred to as "stepping down" the VCO oscillation frequency.

The deviation between the VCO oscillation frequency (or stepped-down frequency) can then be used to adjust the operation of the VCO such that its output oscillation is closer to the intended ideal clock frequency. For example, voltage-controlled oscillators are designed such that the oscillation frequency can be controlled by varying the voltage to vary the current that is input to the VCO. This current is sometimes referred to herein as the "VCO input current" or the "input current," and the voltage of the VCO input current is sometimes referred to herein as the "VCO control voltage" or the "control voltage."

The VCO input current is typically input to the VCO circuit by a component of a phase-lock loop to which the VCO circuit is incorporated. For example, a phase comparator in the phase-lock loop may determine that the VCO oscillation frequency is faster than the ideal clock frequency, and send a "decrement" signal to a charge pump in the phase lock loop. This charge pump may then output a low voltage signal to the VCO circuit, indicating that the VCO circuit should reduce its speed of oscillation. The signal from the charge pump may also pass through a loop filter, which stabilizes the output from the charge pump and reduces ripple in the VCO input current.

A phase-lock loop typically inputs the VCO input current into the VCO circuit opposite the inductor, in a topological sense. For example, the VCO input current may be input to a varactor diode (also sometimes referred to as a varicap diode, a varactor, or a varicap) that is connected to the VCO inductor through the rest of the VCO circuit. Due to the reverse-bias nature of varactor diodes, a change in the voltage of the input current causes a change in the varactor's capacitance. The capacitance of the varactor then influences the VCO inductor, causing the switching frequency of the inductor, and thus the VCO oscillation frequency, to change.

Because varactors are reverse-bias diodes, very little of the VCO input current flows through the varactor to the VCO inductor. For this reason, the inductor end of the VCO circuit is relatively isolated from the voltage of the input current. However, multiple separate sources of voltage operating in the VCO circuit can result in difference in the noise patterns throughout the circuit. These differences in noise patterns can affect the stability of the VCO oscillation frequency, increasing the variation of the amount of time between individual signal oscillations (i.e., increasing jitter). As discussed previously, the increase in jitter from these non-matching noise patterns can prevent the VCO circuit, or the connected computer component(s) (e.g., a set of microprocessor cores), from operating at a desired frequency.

To mitigate the jitter resulting from the difference in noise patterns, the center-tap voltage is sometimes coupled to the VCO control voltage with a capacitor placed between the inductor and varactor. This capacitor is often referred to herein as a "AC coupling capacitor." Similarly to the VCO inductor, the coupling capacitor also is typically biased to a desired reference voltage in order to produce stable operation. This sometimes includes connecting the coupling capacitor to a resistor that is itself connected to a power source. This resistor is sometimes referred to herein as a "coupling resistor." This power source applies a current to the coupling resistor, which passes the current at the desired voltage to the coupling capacitor.

As discussed previously, several aspects of VCO circuit design are addressed to mitigating potential sources of jitter in order to improve the reliability. However, as the demands of systems into which VCO circuits are integrated increase, further improvements to VCO circuit reliability become desirable. For example, data-transfer rates of cutting-edge high-performance systems require are approaching 50 gigabits per second, and future systems may demand even 100 gigabits per second.

Some embodiments of the present disclosure present a novel VCO circuit design that further reduces jitter and thus improves system reliability. Specifically, some embodiments coupling capacitors provide a bias voltage to one or more coupling capacitors in the VCO circuit by connecting the associated coupling resistors to the inductor center-tap connection rather than to a separate current source. In other words, some embodiments of the present disclosure provide a single source for bias voltage for both the VCO inductor and the coupling capacitor(s) by connecting both to the center-tap connection. These embodiments result in less noise produced, less jitter, and higher performance.

FIG. 1 depicts an abstract representation of a varactor node 102 connected to a center-tap bias 104 in a voltage-controlled oscillator circuit 100 that is integrated into a phase-lock loop, in accordance with embodiments of the present disclosure. It is of note that the depiction of FIG. 1 is intended to be an overly simplified presentation for the purposes of understanding. A more detailed presentation of a voltage-controlled oscillator circuit that illustrates some example embodiments of the present disclosure is presented in FIG. 2.

Voltage-controlled oscillator circuit 100 (also referred to as "VCO circuit 100") comprises varactor node 102 and inductor node 106. The precise components and organization of those components included in VCO circuit 100 may vary based on the implementation. For example, while some VCO circuits may include a single varactor node, some VCO circuits, such as differential VCO circuits, may include multiple varactor nodes.

Similarly, the precise components and organization of the components within varactor node 102 and inductor node 106 may vary based on the implementation. For example, inductor node 106 may include various organizations of transistors to drive the oscillation of an inductor. Varactor node 102, for example, may include at least one varactor diode, a coupling capacitor, and a coupling resistor.

FIG. 1 also illustrates a phase comparator circuit 108 and a control-voltage source circuit 110. Phase comparator circuit 108 may receive an oscillation frequency 112 from VCO circuit 100 and compare that oscillation frequency 112 to a reference frequency 114. In some implementations, phase comparator circuit 108 may include a frequency divider that causes the oscillation frequency output by VCO circuit 100 to be a rational multiple of reference frequency 114, or to transform the oscillation frequency output by VCO circuit 100 to be on the same order of magnitude as reference frequency 114.

Phase comparator circuit 108 may calculate a differential between oscillation frequency 112 and reference frequency 114 and output that differential to the control-voltage source circuit 110. Control-voltage source circuit 110 for example, take the form of a charge pump. Control-voltage source circuit 110 may, based on that differential, output either high signal 116 or low signal 118. High signal 116 and low signal 118 may, for example, take the form of high and low control voltage values. Those the chosen control voltage may then be sent to varactor node 102 in VCO circuit 100, altering the oscillation frequency of the circuit.

VCO circuit 104 also is connected to power source 120. Power source 120 may be configured to output a bias voltage to inductor node 106 through center-tap connection 104. However, because varactor node 102 is also connected to center-tap connection 104, the bias voltage at which inductor node 106 operates should also be the bias voltage at which varactor node 102 operates. As discussed previously, this may prevent a difference in the noise patterns of the two nodes of VCO circuit 100, which may lower jitter of the overall VCO circuit 100. This, in turn, may also enable VCO circuit 100 to operate at higher oscillation frequencies at sufficient stability for the components connected to VCO circuit 100 to operate at high performance.

As discussed, FIG. 1 depicts VCO circuit 100 abstracted to a basic node level for the ease of overall understanding. As was also discussed, VCO circuit 100 may include various components that are in various organizations based upon the implementation of VCO circuit 100, and the needs of the system into which VCO circuit 100 is installed, while still remaining within the spirit and scope of the embodiments of the present disclosure.

Figure 2:
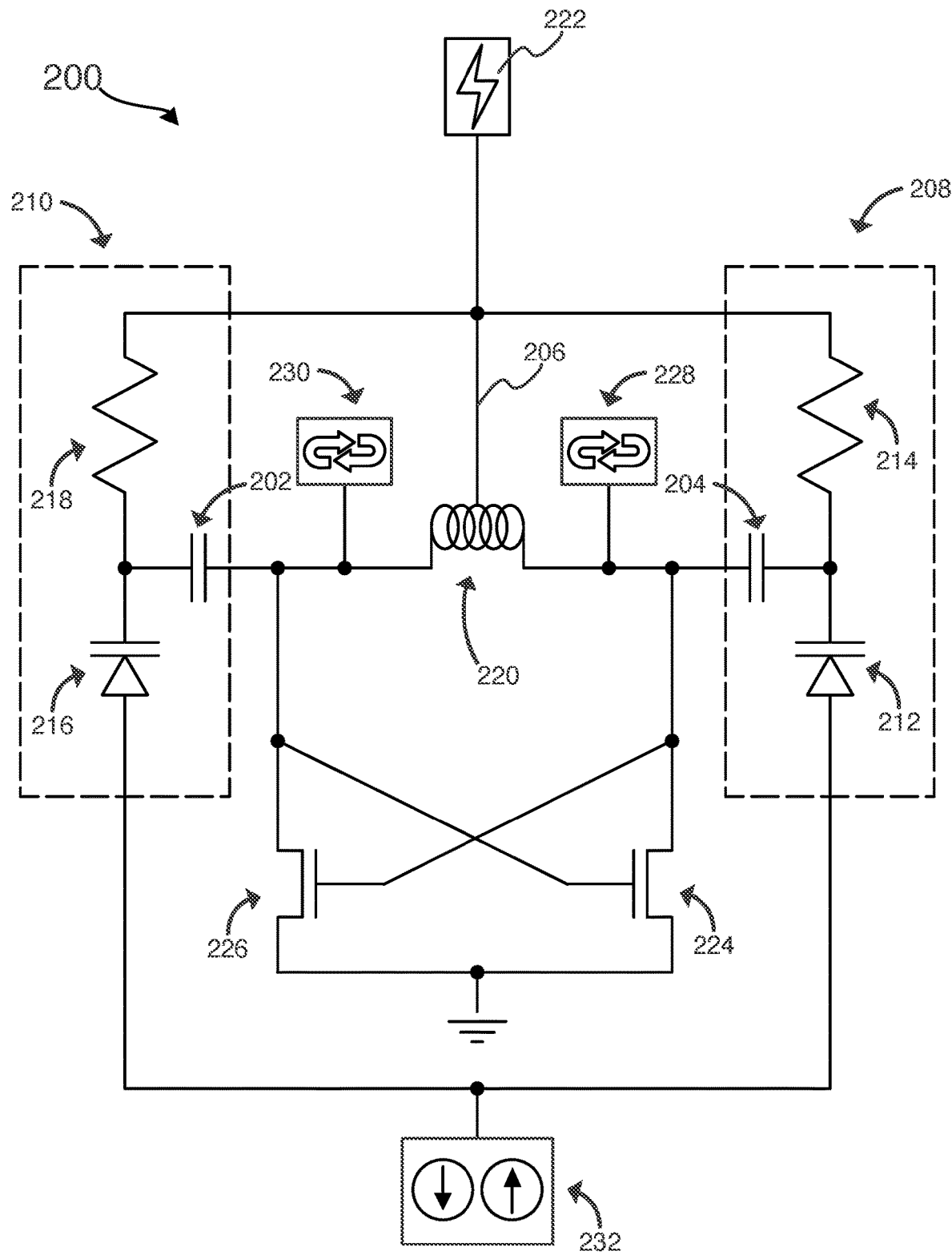
FIG. 2 depicts a simplified schematic representation of a differential voltage-controlled oscillator circuit in which a pair of coupling capacitors are connected to a center-tapped inductor.

FIG. 2 depicts a simplified schematic representation of a differential voltage-controlled oscillator circuit 200 in which a pair of coupling capacitors 202 and 204 are connected to an inductor center tap 206 (also referred to herein as center-tap connection 206). Voltage-controlled oscillator circuit 200 (also referred to herein as "VCO 200") outputs an oscillation frequency to a phase-lock loop through outputs 228 and 230. Further, VCO 200 receives a control voltage signal from charge pump 232, which may be part of the phase lock loop. This control voltage signal may be filtered by a loop filter between charge pump 232 and VCO 200.

Voltage-controlled oscillator circuit 200 includes two varactor nodes 208 and 210 (demarcated within FIG. 2 by dashed lines). Varactor node 208 contains varactor 212, coupling capacitor 204, and coupling resistor 214. Similarly, varactor node 210 contains varactor 216, coupling capacitor 202, and coupling resistor 218. VCO 200 also contains inductor 220 which is connected to biasing voltage source 222, such as a mirror circuit, through center-tap connection 206. Biasing voltage source 222 provides the biasing voltage at which inductor 220 oscillates during operation. Inductor 220 is driven by a set of transistors 224 and 226, which cause the oscillation of inductor 220. As illustrated, transistors 224 and 226 are organized in a cross-couple configuration, but other configurations are possible.

As illustrated, coupling resistors 214 and 218 are connected to center-tap connection 206. For this reason, biasing voltage source 222 not only provides a biasing voltage to inductor 220, but also to varactor nodes 208 and 210. Specifically, the biasing voltage is provided to coupling capacitors 202 and 204 through coupling resistors 214 and 218 respectively. As such, inductor 220 and coupling capacitors 202 and 204 are all biased by the same voltage source in VCO 200. This may reduce differences in noise patterns throughout VCO 200, further reducing jitter and increasing performance.

At several points in this disclosure, the word "between" is used to describe the location of multiple components in a VCO circuit or larger system. Unless otherwise indicated or unless inconsistent with other context, describing a first component "between," two other components (as opposed to describing, for example, time between events or differences between concepts) should be interpreted as suggesting that first component is located between those two other components with respect to the flow of electrons or the flow of a signal through the circuit in which those components are integrated. For example, as illustrated in FIG. 2, coupling capacitor 204 can be described as located between inductor 220 and varactor 212, even though, as actually implemented in a physical circuit, coupling capacitor 204 may not be located physically between inductor 220 and varactor 212.

Figure 3:
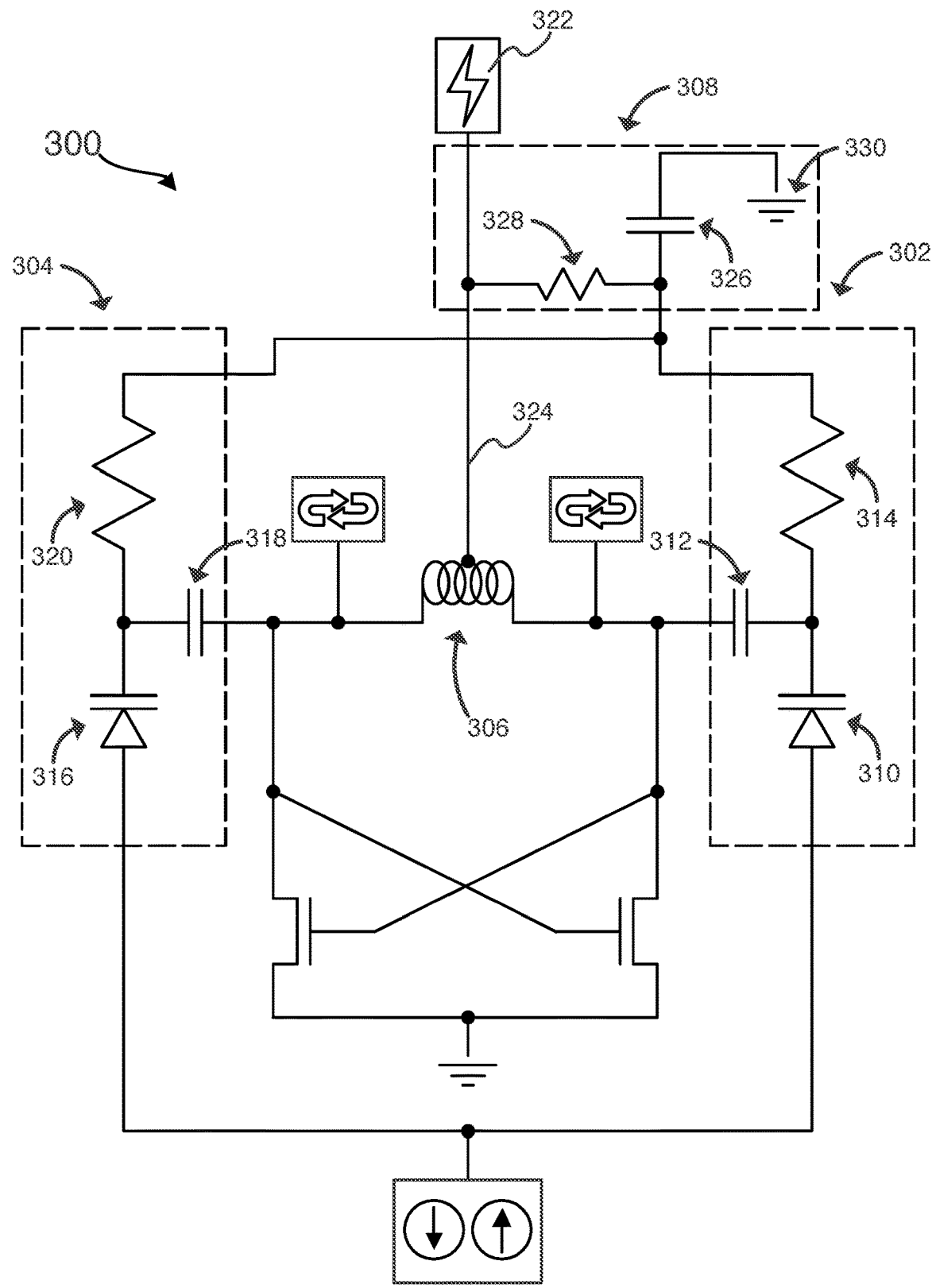
FIG. 3 depicts a simplified schematic representation of a differential voltage-controlled oscillator circuit in which a pair varactor nodes are connected to a center-tapped inductor that is connected to a filter network.

FIG. 3 depicts a simplified schematic representation of a differential voltage-controlled oscillator circuit 300 in which a pair varactor nodes 302 and 304 are connected to a center-tapped inductor 306 through a filter network 308. The overall structure of voltage-controlled oscillator circuit 300 (sometimes referred to herein as "VCO 300") may resemble the structure of voltage-controlled oscillator circuit 200 of FIG. 2.

For example, like VCO 200, VCO 300 includes two varactor nodes 302 and 304 (demarcated within FIG. 3 by dashed lines). Varactor node 302 contains varactor 310, coupling capacitor 312, and coupling resistor 314. Similarly, varactor node 304 contains varactor 316, coupling capacitor 318, and coupling resistor 320. VCO 300 also contains inductor 306 which is connected to biasing voltage source 322, such as a mirror circuit, through center-tap connection 324. Biasing voltage source 322 provides the biasing voltage at which inductor 306 oscillates during operation.

As illustrated, coupling resistors 314 and 320 are connected to center-tap connection 324 through filter network 308 (demarcated within FIG. 3 by dashed lines). As such, unlike in VCO 200, in VCO 300 coupling capacitors 312 and 318 are connected to biasing voltage source not only through coupling resistors 314 and 320, but also through filter network 308. Filter network 308, as illustrated, comprises capacitor 326. The filter network also comprises resistor 328. The filter network is connected to ground 330 at one end and biasing voltage source 322 at the other end.

Similar to in VCO 200, biasing voltage source 322 not only provides a biasing voltage to inductor 306, but also to varactor nodes 302 and 304. Specifically, the biasing voltage is provided to coupling capacitors 312 and 318 from filter network 308 and through coupling resistors 314 and 320 respectively. As such, inductor 306 and coupling capacitors 312 and 318 are all biased by the same voltage source in VCO 300. This may reduce differences in noise patterns throughout VCO 300, further reducing jitter and increasing performance.

Figure 4:
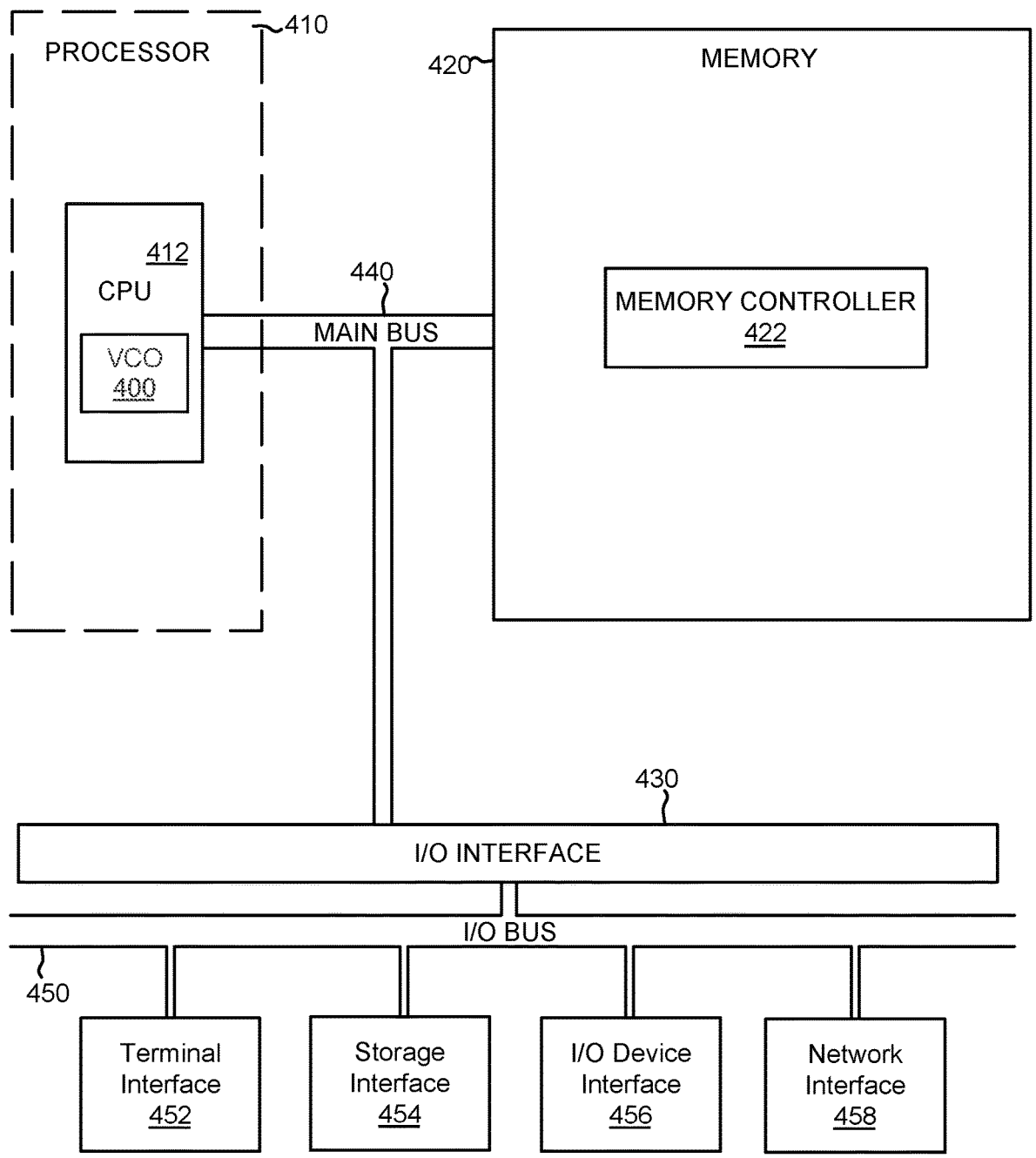
FIG. 4 depicts the representative major components of a computer system into which a voltage-controlled oscillator circuit may be integrated in accordance with embodiments.

FIG. 4 depicts the representative major components of an example Computer System 401 that may be used in accordance with embodiments of the present disclosure. The particular components depicted are presented for the purpose of example only and are not necessarily the only such variations. The Computer System 401 may include a Processor 410, Memory 420, an Input/Output Interface (also referred to herein as I/O or I/O Interface) 430, and a Main Bus 440. The Main Bus 440 may provide communication pathways for the other components of the Computer System 401. In some embodiments, the Main Bus 440 may connect to other components such as a specialized digital signal processor (not depicted).

The Processor 410 of the Computer System 401 may include one or more CPUs 412. The Processor 410 may additionally include one or more memory buffers or caches (not depicted) that provide temporary storage of instructions and data for the CPU 412. The CPU 412 may perform instructions on input provided from the caches or from the Memory 420 and output the result to caches or the Memory 420. The CPU 412 may include one or more circuits configured to perform one or methods consistent with embodiments of the present disclosure. For example, the CPU 412 includes at least one VCO 400 configured to provide oscillation signals at a frequency that serves as the clock for the CPU 412. In some embodiments, the Computer System 401 may contain multiple Processors 410 typical of a relatively large system. In other embodiments, however, the Computer System 401 may be a single processor with a singular CPU 412. Similarly, in some embodiments, VCO 400 may be dedicated to all of processor 410, and thus VCO 400 may provide a clock frequency for multiple, or all, CPUs of Processor 410. Finally, in some embodiments VCO 400 may be located outside Processor 410, and may provide a clock frequency for multiple components of Computer System 401.

The Memory 420 of the Computer System 401 may include a Memory Controller 422 and one or more memory modules for temporarily or permanently storing data (not depicted). In some embodiments, the Memory 420 may include a random-access semiconductor memory, storage device, or storage medium (either volatile or non-volatile) for storing data and programs. The Memory Controller 422 may communicate with the Processor 410, facilitating storage and retrieval of information in the memory modules. The Memory Controller 422 may communicate with the I/O Interface 430, facilitating storage and retrieval of input or output in the memory modules. In some embodiments, the memory modules may be dual in-line memory modules.

The I/O Interface 430 may include an I/O Bus 450, a Terminal Interface 452, a Storage Interface 454, an I/O Device Interface 456, and a Network Interface 458. The I/O Interface 430 may connect the Main Bus 440 to the I/O Bus 450. The I/O Interface 430 may direct instructions and data from the Processor 410 and Memory 420 to the various interfaces of the I/O Bus 450. The I/O Interface 430 may also direct instructions and data from the various interfaces of the I/O Bus 450 to the Processor 410 and Memory 420. The various interfaces may include the Terminal Interface 452, the Storage Interface 454, the I/O Device Interface 456, and the Network Interface 458. In some embodiments, the various interfaces may include a subset of the aforementioned interfaces (e.g., an embedded computer system in an industrial application may not include the Terminal Interface 452 and the Storage Interface 454).

Logic modules throughout the Computer System 401—including but not limited to the Memory 420, the Processor 410, and the I/O Interface 430—may communicate failures and changes to one or more components to a hypervisor or operating system (not depicted). The hypervisor or the operating system may allocate the various resources available in the Computer System 401 and track the location of data in Memory 420 and of processes assigned to various CPUs 412. In embodiments that combine or rearrange elements, aspects of the logic modules' capabilities may be combined or redistributed. These variations would be apparent to one skilled in the art.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A voltage-controlled oscillator comprising:
   an inductor, wherein the inductor is connected to a center-tap connection;
   a power source configured to provide a bias voltage to the inductor through the center-tap connection;
   a first coupling capacitor;
   a filter network between the center-tap connection and the first coupling capacitor; and a first coupling resistor located between the first coupling capacitor and the center-tap connection.

2. The voltage-controlled oscillator of claim 1, further comprising:
a first varactor, wherein a capacitance of the first varactor is dependent upon a control voltage;
wherein the first coupling capacitor is located between the inductor and the first varactor.

3. The voltage-controlled oscillator of claim 2, wherein the voltage-controlled oscillator is a differential oscillator and further comprises:
a second varactor, wherein a capacitance of the second varactor is dependent upon the control voltage;
a second coupling capacitor located between the inductor and the second varactor; and
a second coupling resistor located between the second coupling capacitor and the center-tap connection, wherein the center-tap connection provides the bias voltage to the second coupling capacitor through the second coupling resistor.

4. The voltage-controlled oscillator of claim 3, further comprising a filter network between the center-tap connection and the first and second coupling capacitors.

5. The voltage-controlled oscillator of claim 1, wherein the center-tap connection provides the bias voltage to the first coupling capacitor through the first coupling resistor.

6. A system comprising:
a processor; and
a voltage-controlled oscillator, the voltage-controlled oscillator comprising:
an inductor, wherein the inductor is connected to a center-tap connection;
a power source configured to provide a bias voltage to the inductor through the center-tap connection;
a first coupling capacitor; and
a first coupling resistor located between the first coupling capacitor and the center-tap connection, wherein the center-tap connection provides the bias voltage to the first coupling capacitor through the first coupling resistor.

7. The system of claim 6, wherein the voltage-controlled oscillator is located within the processor, and wherein the voltage-controlled oscillator provides a clock frequency to a module of the processor.

8. The system of claim 6, wherein the voltage-controlled oscillator is located outside of the processor, and wherein the voltage-controlled oscillator provides a clock frequency to at least one component of the computer system.

9. The system of claim 6, wherein the voltage-controlled oscillator further comprises a filter network between the center-tap connection and the first coupling capacitor.

10. The system of claim 6, further comprising a first varactor.

11. The system of claim 10, wherein the voltage-controlled oscillator further comprises:
a second varactor;
a first coupling capacitor located between the inductor and the first varactor;
a second coupling capacitor located between the inductor and the second varactor; and
a second coupling resistor located between the second coupling capacitor and the center-tap connection, wherein the center-tap connection provides the bias voltage to the second coupling capacitor through the second coupling resistor.

12. The system of claim 11, wherein the voltage-controlled oscillator further comprises a filter network between the center-tap connection and the first and second coupling capacitors.

13. The system of claim 11, wherein a capacitance of the first varactor is dependent upon a control voltage and a capacitance of the second varactor is dependent upon the control voltage.

14. A method of providing a bias voltage to a voltage-controlled circuit, the method comprising:
providing the bias voltage to an inductor of the voltage-controlled circuit from a power source and through a center-tap connection of the inductor; and
providing the bias voltage to a first coupling capacitor of the voltage-controlled circuit from the power source and through the center-tap connection, wherein the first coupling capacitor is located within a first varactor node.

15. The method of claim 14, wherein the first varactor node comprises:
a first varactor located between the first coupling capacitor and a source of control voltage; and
a first coupling resistor located between the first coupling capacitor and the center-tap connection.

16. The method of claim 14, wherein the method further comprises providing the bias voltage to a second coupling capacitor of the voltage-controlled circuit from the power source and through the center-tap connection.

17. The method of claim 16, wherein the method further comprises filtering the bias voltage with a filter network between the center-tap connection and the first and second coupling capacitors.

18. The method of claim 16, wherein the first varactor node comprises:
a first varactor located between the first coupling capacitor and a source of control voltage; and
a first coupling resistor located between the first coupling capacitor and the center-tap connection; and
wherein the second coupling capacitor is located within a second varactor node that comprises:
a second varactor located between the second coupling capacitor and the source of control voltage; and
a second coupling resistor located between the second coupling capacitor and the center-tap connection.

19. The method of claim 14, wherein the method further comprises filtering the bias voltage with a filter network between the center-tap connection and the first coupling capacitor.

* * * * *